(12) United States Patent
Bauer et al.

(10) Patent No.: US 7,795,742 B2
(45) Date of Patent: Sep. 14, 2010

(54) SEMICONDUCTOR DEVICE HAVING A SEMICONDUCTOR CHIP, AND METHOD FOR THE PRODUCTION THEREOF

(75) Inventors: Michael Bauer, Nittendorf (DE); Edward Fuergut, Ligusterweg (DE)

(73) Assignee: Infineon Technologies AG, Neubiberg (DE)

( * ) Notice: Subject to any disclaimer, the term of this patent is extended or adjusted under 35 U.S.C. 154(b) by 814 days.

(21) Appl. No.: 11/535,780

(22) Filed: Sep. 27, 2006

(65) Prior Publication Data

US 2007/0085216 A1    Apr. 19, 2007

(30) Foreign Application Priority Data

Sep. 27, 2005    (DE) .................. 10 2005 046 280

(51) Int. Cl.
*H01L 23/48* (2006.01)
(52) U.S. Cl. .................. 257/778; 257/787; 257/795; 438/108; 438/124
(58) Field of Classification Search ......... 257/778–795; 438/108, 124, 126, 127
See application file for complete search history.

(56) References Cited

U.S. PATENT DOCUMENTS 5,759,737 A * 6/1998 Feilchenfeld et al. ....... 430/311
5,952,718 A * 9/1999 Ohtsuka et al. ............. 257/737
6,191,483 B1   2/2001 Loo
2002/0047212 A1   4/2002 Chen
2003/0004027 A1   1/2003 Gassmann
2004/0149479 A1   8/2004 Chiu et al.
2005/0012208 A1   1/2005 Jang et al.
2005/0028361 A1   2/2005 Yin et al.
2005/0056933 A1   3/2005 Chung

FOREIGN PATENT DOCUMENTS

| EP | 1022774 A2 | 7/2000 |
|---|---|---|
| EP | 1126517 A2 | 8/2001 |
| EP | 1463103 A1 | 9/2004 |
| WO | WO01/20658 A1 | 3/2001 |
| WO | WO02/33750 A1 | 4/2002 |

\* cited by examiner

*Primary Examiner*—Thinh T Nguyen
(74) *Attorney, Agent, or Firm*—Dicke, Billig & Czaja, PLLC

(57) ABSTRACT

A semiconductor device having a semiconductor chip having an active surface with flip-chip contacts and a passive surface is disclosed. In one embodiment, the flip-chip contacts are surrounded by an electrically insulating layer as underfill material, the layer having a UV B-stageable material. The UV B-stageable material is applied on the active surface of the semiconductor wafer.

21 Claims, 3 Drawing Sheets

SEMICONDUCTOR DEVICE HAVING A SEMICONDUCTOR CHIP, AND METHOD FOR THE PRODUCTION THEREOF

CROSS-REFERENCE TO RELATED APPLICATIONS

This Utility Patent Application claims priority to German Patent Application No. DE 10 2005 046 280.4 filed on Sep. 27, 2005, which is incorporated herein by reference.

BACKGROUND

The invention relates to a semiconductor device having a semiconductor chip.

In order to increase the reliability between a semiconductor device having flip-chip contacts and a circuit carrier or rewiring substrate particularly during cycling test, after surface mounting the interspace between the active surface of the semiconductor device and the circuit carrier is filled by an underfill material. A slow dispensing process is used for this purpose.

For this dispensing process, alongside the semiconductor device it is necessary to allocate a correspondingly large area on the circuit carrier in order that corresponding tools can introduce the underfill material into the interspace between the semiconductor device and the circuit carrier. This area requirement and also the slow dispensing process have a disadvantageous effect on the manufacturing throughput. Furthermore, this filling is restricted to underfill materials which are able to fill the interspace between the underside of the semiconductor device and the circuit carrier with the aid of capillary action.

It is know from US 2005/0012208, for example, to apply a layer that may serve as underfill material to a semiconductor wafer by means of a spinning or printing process. Afterward, the individual semiconductor chips with an underfill layer can be separated from the wafer.

This method has the disadvantage, however, that the flip-chip contacts are soiled or even covered with the underfill material. The layer has to be removed from the tips of the flip-chip contacts in a further method process in order to make it possible to produce a good electrical connection between the flip-chip contacts and the rewiring substrate.

Furthermore, the layer is normally removed mechanically from the flip-chip contacts. This can lead to damage to the flip-chip contacts.

For these and other reasons, there is a need for the present invention.

SUMMARY

One embodiment provides a semiconductor device having a semiconductor chip having an active surface with flip-chip contacts and a passive surface. The flip-chip contacts are surrounded by an electrically insulating layer as underfill material, the layer having a UV B-stageable material. The UV B-stageable material is applied on the active surface of the semiconductor wafer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a basic schematic diagram of a semiconductor wafer with flip-chip contacts.

FIG. 3 illustrates a basic schematic diagram of a semiconductor wafer with an electrically insulating layer according to a first embodiment.

FIG. 4 illustrates a basic schematic diagram of a UV irradiation of the layer through a patterned mask.

FIG. 5 illustrates the layer after the removal of the unexposed regions.

FIG. 6 illustrates the application of an electrically insulating layer according to a second embodiment of the invention.

FIG. 7 illustrates the layer from FIG. 6 after a UV irradiation through a patterned mask.

DETAILED DESCRIPTION

Figure 1:
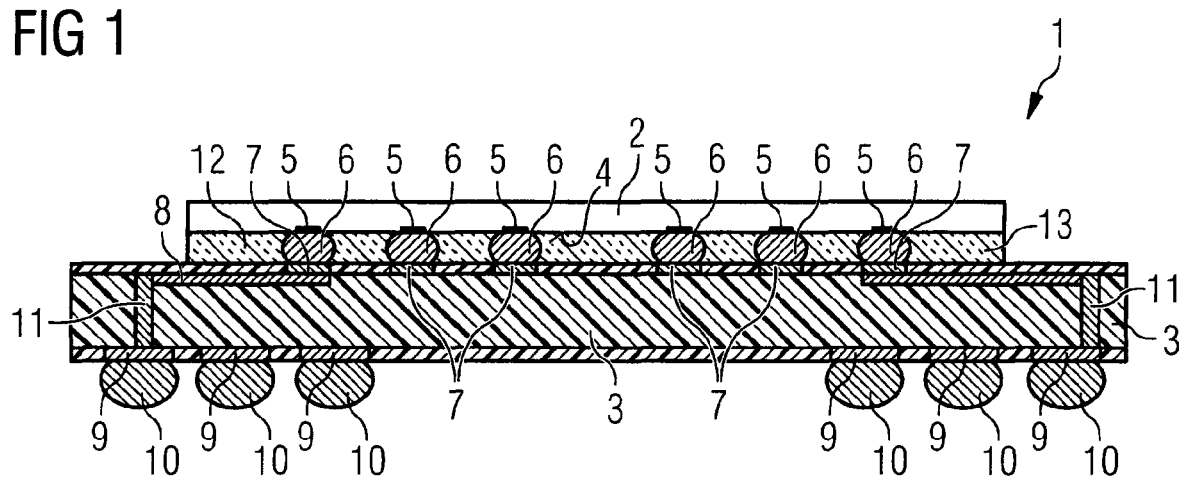
FIG. 1 illustrates a schematic cross section through a semiconductor device according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor device in which the underfill material can be applied on the wafer and the flip-chip contacts can be cleaned without the flip-chip contacts being damaged.

In one embodiment, the invention provides a semiconductor device having a semiconductor chip having an active surface with flip-chip contacts and a passive surface. The flip-chip contacts are surrounded by an electrically insulating layer as underfill material. The electrically insulating layer includes a UV B-stageable material.

UV B-stageable materials contain, for example, acrylates, azo groups, peroxide compounds or readily cleavable halides such as bromine-carbon compounds. If they are exposed with UV radiation, they form free radicals or ions which bring about a curing reaction.

The device according to the invention has the advantage that the UV B-stageable material makes it possible to apply a layer as underfill material at the wafer level since the UV B-stageable material can be cured in two processes. After its application on the active surface of the semiconductor chip, the UV B-stageable material can be brought to a partly cured intermediate state, the B-stage. This can be performed by UV irradiation of the layer. The layer is applied on the semiconductor wafer and then the coated semiconductor chips are separated from the wafer.

The separated semiconductor chip thus has flip-chip contacts and underfill material, after separation the underfill material forming at least part of the uncovered surface of the semiconductor chip. Consequently, after the semiconductor chip has been mounted on a substrate it is possible to dispense with an additional process for filling the interspace between the active surface of the semiconductor chip and the substrate. The process is slow and unreliable since the interspace is filled with the liquid underfill material by means of capillary action.

After the application of the device according to the invention on the rewiring substrate, the electrical connection and the curing of the pre-applied underfill material can be performed in one method step. The semiconductor device according to the invention can be mounted more rapidly on the substrate.

Moreover, the risk of blistering within the underfill material is avoided by means of the pre-applied underfill material. Blistering can lead to the failure of the device since the device is only poorly protected against moisture. The pre-applied layer made of UV B-stageable material enables a faster and more reliable process sequence.

The semiconductor chip according to the invention with pre-applied UV B-stageable material as underfill material has the further advantage that space is saved when it is mounted on a substrate. The underfill material is not applied by means of dispensing, so that space for the dispensing tool is not required. Furthermore, a fillet joint made of underfill material is not produced around the edge sides of the semiconductor chip. This also enables a small substrate or a dense packing of adjacent semiconductor chips in a panel.

In one embodiment, the layer has a thickness d greater than the height h of the flip-chip contact tips. The tips of the flip-chip contacts are normally prevented from being covered with the underfill material since the material has to be removed. The use of UV B-stageable material simplifies the removal since the material can be brought to the B-stage or to the partly cured intermediate state.

As an alternative, the electrically insulating layer may have a thickness d, the flip-chip contact tips projecting with a height a from the layer, where $a \leq d$. This embodiment has the advantage that the contact tips are free of the underfill material and can be electrically connected to the substrate more simply.

The electrically insulating layer may have openings each with a flip-chip contact arranged therein. At least the tips of the contacts are free of the UV B-stageable material. The base region of each contact is surrounded by the layer. This embodiment has the advantage that a reliable electrical connection to the flip-chip contacts is made possible and at the same time a sufficient layer is provided as underfill material. This leads to a more reliable surface mounting of the semiconductor chip.

In one embodiment, at least the surface of the UV B-stageable material is in a partially cured intermediate state. The UV B-stageable material is brought to the B-stage under UV radiation. This state provides a stable surface of the layer, so that the semiconductor chip or semiconductor wafer can be reliably processed further or stored.

As an alternative, the UV B-stageable material may be substantially fully cured. The material may be fully cured by means of heat treatment.

In one embodiment, the UV B-stageable material includes epoxy-based material or acrylic-based material. The UV B-stageable material may include a proportion of up to approximately 10% of organic solvent. After the application of the material on the active surface, the solvent can be evaporated. This has the advantage that the thickness of the applied layer is reduced and the tip of the flip-chip contacts is only covered by a very thin layer. Owing to the flip-chip contacts, elevations are formed in the surface of the layer. This embodiment has the advantage that the cleaning of the contact tip is simplified since less material has to be removed from the contact tips.

The use of a UV B-stageable material as underfill material may have the further advantage that the UV B-stageable material includes a filler proportion of 30% by volume to 95% by volume, preferably 70% by volume to 85% by volume, the remainder plastic, since the material does not surround the flip-chip contacts by capillary action.

Such a high filler proportion provides a better thermal matching of the underfill material layer to the coefficient of expansion of the rewiring substrate. This can be realized with the semiconductor devices according to the invention because the interspaces between the external contacts do not have to be filled in the already surface-mounted state, rather the underfill material can be applied directly onto the active surface of the semiconductor device. Consequently, a capillary action does not have to be taken into consideration and the filler proportion can thus be increased as desired, especially as a low viscosity of the molten underfill material, such as occurs with a low filler proportion, is not required for this compensation layer.

It is furthermore provided that the underfill material includes ceramic particles as filler in order to ensure the thermal compensation.

The UV B-stageable material may be water-soluble in a non-cured intermediate state. This simplifies the removal of the layer since complex working conditions and the environmentally friendly disposal of organic solvents can be avoided.

The semiconductor device according to the invention may furthermore have a rewiring substrate with internal contact areas on its top side and external contact areas on its underside. The semiconductor device is accommodated with its active surface towards the top side of the rewiring substrate. The arrangement of the internal contact areas of the rewiring substrate corresponds to the arrangement of the chip contact area on the active surface of the semiconductor device. The semiconductor device is accommodated such that a flip-chip contact is in each case arranged between a chip contact area and an internal contact area. Solder balls may be provided as flip-chip contacts.

In one embodiment, the flip-chip contacts are electrically connected to the internal contact areas and the layer as underfill material surrounds the flip-chip contacts. The area of the layer as underfill material substantially corresponds to the area of the semiconductor chip. The electrical connection between the semiconductor chip and the rewiring substrate and the curing of the layer can be produced simultaneously during heat treatment, the solder reflow process.

The device according to the invention with a layer made of UV B-stageable material as underfill material provides a surface-mountable device which can be mounted on a rewiring substrate very simply and in one process step. An additional process for producing an underfill layer is thus avoided.

The semiconductor device according to one of the preceding embodiments may have the form of a semiconductor wafer. The semiconductor wafer has a plurality of semiconductor device positions for semiconductor devices which are arranged in rows and columns. The device positions have contact areas in flip-chip technology on the active top side, the contact areas each having a flip-chip contact. This form makes it possible to apply the electrically insulating layer on a plurality of semiconductor devices in one process step. This simplifies the production method and reduces the production costs.

A method for producing a semiconductor device includes the following method processes. Firstly, a semiconductor wafer is provided. The semiconductor wafer has semiconductor device positions arranged in rows and columns for semiconductor devices in flip-chip technology with contact areas on the active top side. Flip-chip contacts are arranged on the contact areas.

An electrically insulating layer as underfill material is applied to the active surface of the semiconductor wafer whilst covering the flip-chip contacts. According to the invention, the layer includes a UV B-stageable material. A patterned mask is then applied to the active surface of the semiconductor wafer. The layer is exposed through the mask by means of UV radiation, so that the flip-chip contacts are not exposed and at least the surface of the exposed regions is brought to a cured intermediate state. The unexposed regions of the layer are removed whilst leaving free at least the tip of the flip-chip contacts. The semiconductor wafer is subsequently separated into individual semiconductor devices.

According to the invention, the layer as underfill material is exposed by means of UV irradiation. Since the layer includes UV B-stageable material, the exposed regions are brought to the B-stage or to the intermediate state. The layer is relatively solid in this state. In contrast thereto, the unexposed regions that are not in an intermediate state can be removed in a simple manner. This method makes it possible to clean the excess layer from the tips of the flip-chip contacts in a simple and spatially accurate manner.

The method according to the invention has the advantage that a mechanical cleaning of the flip-chip contact tip is avoided. The risk of mechanical damage to the contacts is therefore also avoided and the reliability of the production method is increased.

A patterned mask is used in order that the regions of the layer which lie on the flip-chip contact tips are not exposed by the UV radiation. It is possible to use the mask used for producing the chip contact areas. The use of this mask simplifies the adaptation of the openings in the layer with the underlying flip-chip contacts. The method according to the invention has the advantage that reliable phototechnologies can be used for carrying out the patterning of the layer made of UV B-stageable material.

The UV B-stageable material has the further advantage that the layer can be fully cured later after the device has been mounted on a rewiring substrate. The second curing process may be performed by means of a heat treatment. After the mounting method, the layer fulfills the functions of the underfill material since it is fully cured, surrounds the flip-chip contacts and specifies a fixed connection to the surface of the semiconductor device and also the top side of the rewiring substrate.

In a further embodiment, solvent is evaporated after the application of the layer as underfill material. The functionality of the device can be tested in a further step. Since the flip-chip contact tips are uncovered before the wafer is separated into individual semiconductor devices, it is possible to test the functionality of the semiconductor device in the semiconductor device positions via the external contact tips. It is not until after the semiconductor device positions which have failed the functional test have been marked that the wafer is then separated and only the semiconductor devices which are functional are processed further.

The electrically insulating layer as underfill material may be applied by means of spin-coating, dispensing spraying on, jet printing methods, stencil printing method or dipping methods. Simple and fast deposition techniques can be used since the layer according to the invention can be removed simply and reliably from the tips of the flip-chip contacts by means of the UV irradiation of the patterned mask. An additional patterned mask and complex selective application of the layer are thus avoided.

The method may also have the following additional processes. A rewiring substrate with internal contact areas on its top side and external contact areas on its underside is provided. The semiconductor device is applied to the top side of the rewiring substrate, so that the flip-chip contacts touch the internal contacts. A heat treatment whilst producing electrical connections between the flip-chip contacts and the internal contact areas and whilst curing the UV B-stage material of the layer is performed. In this step, the interspace between the active surface of the semiconductor device and the surface of the rewiring substrate is filled with the UV B-stageable material of the layer. A fillet joint is not produced at the edge sides of the semiconductor device or around the edge sides of the device since the layer is not in a liquid state but rather in a solid intermediate state before the curing process.

In a further method process, the rear side of the mounted semiconductor device may be embedded in a plastic housing composition in order to provide a packaged device.

FIG. 1 illustrates a schematic cross section through an electronic semiconductor device 1 according to the invention. The semiconductor device 1 has a semiconductor chip 2 and a rewiring substrate 3. The semiconductor chip 2 has an active surface 4 having integrated circuit elements and a plurality of chip contact areas 5. A flip-chip contact 6 in the form of a solder ball is arranged on each chip contact area 5.

The rewiring substrate 3 has a top side with internal contact areas 7 which are electrically connected via conductor tracks 8 and through contacts 11 to external contact areas 9 on the underside of the substrate 3. External contacts 10 in the form of solder balls are arranged on the external contact areas 9, via which the semiconductor device 1 can be mounted onto a superordinate printed circuit board (not illustrated).

The semiconductor chip 2 is mounted and electrically connected on the top side of the rewiring substrate 3 via the flip-chip contacts 6. The interspace 12 between the active surface 4 of the semiconductor chip 2 and the top side of the rewiring substrate 3 is filled with a UV B-stageable material 13. The UV B-stageable material 13 surrounds the flip-chip contacts 6 and has the function of an underfill material which protects the flip-chip contacts 6 against environmental damage and in particular against atmospheric humidity.

The UV B-stageable material 13 has the form of a layer having an area that substantially corresponds to the area of the active surface 5 of the semiconductor chip 2. Owing to the production method, the UV B-stageable material 13 does not form a fillet joint around the edge sides of the semiconductor chip 2.

According to the invention, the UV B-stageable material 13 is applied on the active surface of a semiconductor wafer and brought to a solid intermediate state. The individual semiconductor chips are separated from the wafer after coating. This method is explained in more detail in conjunction with FIGS. 2 to 7.

In devices in which the underfill material is applied by means of dispensing after the mounting of the semiconductor chip on the rewiring substrate, the underfill material forms a fillet joint at the edge sides of the semiconductor chip. In contrast thereto, the UV B-stageable material 13 according to the invention does not form a fillet joint around the edge sides of the semiconductor chip 2 since the underfill material is arranged on the chip prior to the mounting of the semiconductor chip on the rewiring substrate and is in a solid state.

FIGS. 2 to 5 illustrate a method for producing an underfill material on a semiconductor wafer according to a first embodiment of the invention.

Figure 2:
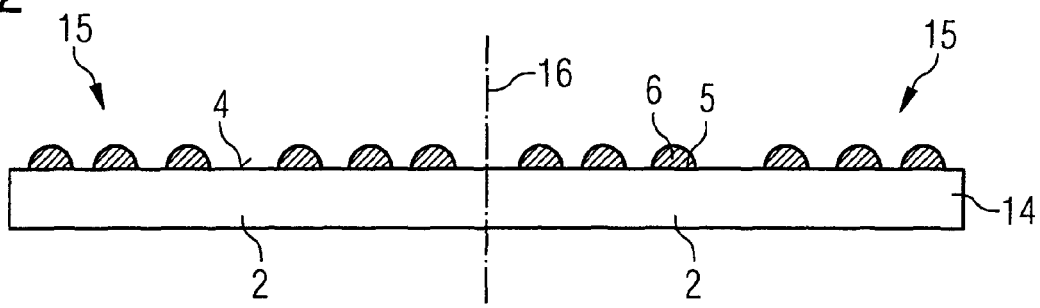
FIGS. 2 to 5 illustrate a method for producing an underfill layer on a semiconductor wafer according to a first embodiment of the invention.

FIG. 2 illustrates a basic schematic diagram of a semiconductor wafer 14 having a plurality of semiconductor device positions 15 arranged in rows and columns. FIG. 2 illustrates two device positions 15 of the wafer 14. The device positions 15 are separated from one another by means of separating lines 16, which are illustrated here as broken lines. Each device position 15 provides a semiconductor chip 2. The semiconductor wafer 14 has an active surface 4 with integrated circuit elements (not illustrated here) and chip contact areas 5. According to the invention, the flip-chip contacts 6 are applied on the chip contact areas 5 prior to the separation of the device positions 15.

Figure 3:
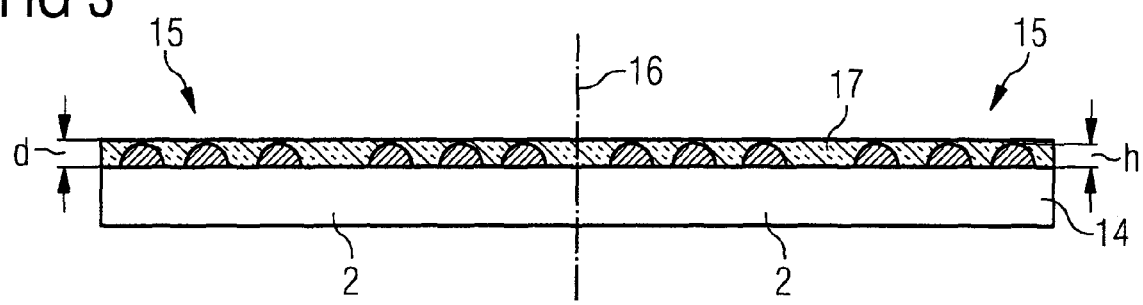

FIG. 3 illustrates the next process of the method according to the invention, in which a layer 17 is applied on the active surface 4 of the wafer 14. This was performed by means of spin-coating in this embodiment. According to the invention, the layer 17 includes an electrically insulating UV B-stageable material 13.

In the first embodiment of the invention, the layer 17 has a thickness d greater than the height h of the flip-chip contacts 6. The flip-chip contacts 6 are thus fully covered at the layer 17.

Figure 4:
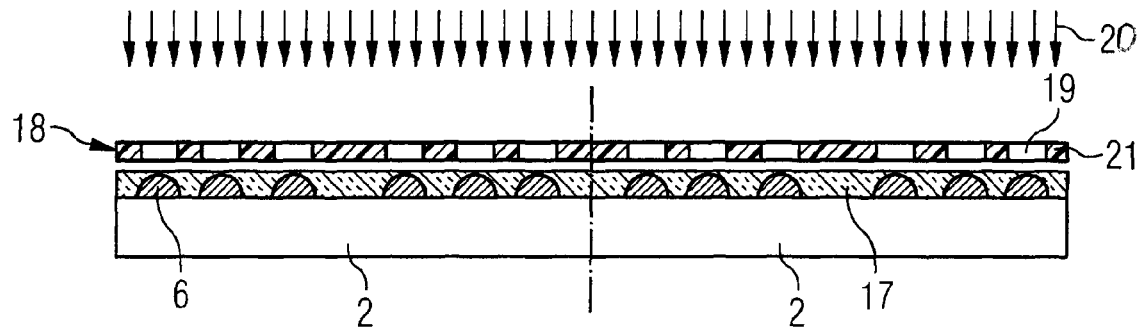

FIG. 4 illustrates the freeing of the flip-chip contact tip 6 by means of photo patterning techniques. According to the invention, a mask 18 is used which is patterned such that the regions 19 of the surface of the layer 17 which lie on the flip-chip contacts are covered and are not exposed. The layer 17 is selectively exposed with UV radiation through the mask.

As a result of the exposure, the UV B-stageable materials, which contain for example acrylates, azo groups, peroxide compounds or readily cleavable halides such as bromine-carbon compounds, form free radicals or ions which bring about the curing reaction.

The exposed regions 21 of the layer 17 are at least partly cured and brought to the B-stage owing to the UV irradiation 20. The covered regions 19 are therefore not exposed by the UV radiation 20 and, consequently, are not brought to the B-stage or to the cured intermediate state.

Figure 5:
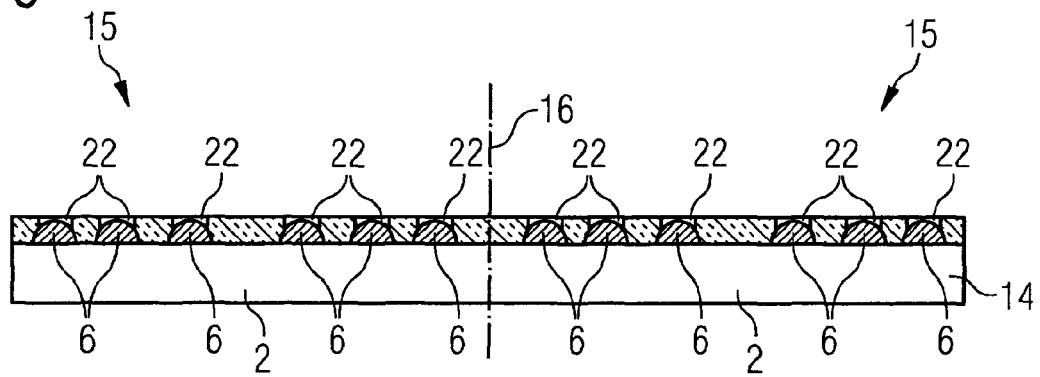

FIG. 5 illustrates the semiconductor wafer 14 after the UV irradiation. The unexposed regions 19 of the layer 17 are in a non-cured state and can be removed in a simple manner by means of a suitable solvent. In this case, the non-cured UV B-stageable material is water-soluble. After the removal of the unexposed regions 19, openings 22 arise in the surface of the layer 17. The arrangement of the openings 22 corresponds to the arrangement of the flip-chip contacts 6. The tip of a flip-chip contact 6 is thus situated in each opening 22 and is free of the UV B-stageable material 13 of the layer 17.

Afterwards, the individual device positions 15 can be separated from the wafer 14 by means of sawing at the separating lines 16. The layer 17 patterned in this way on the semiconductor chip 2 may serve as underfill material.

The semiconductor chip 2 is applied to the rewiring substrate 3, so that each flip-chip contact 6 touches an internal contact area 7. A solder reflow method is performed in order that an electrical and mechanical connection between the semiconductor chip 2 and the rewiring substrate 3 is produced. At the same time, the UV B-stageable material 13 of the layer 17 is cured by the thermal treatment in order to specify the underfill material of the device 1.

The rear side and also the edge sides of the semiconductor chip 2 may be embedded in a plastic housing composition in a further embodiment (not illustrated).

Figure 6:
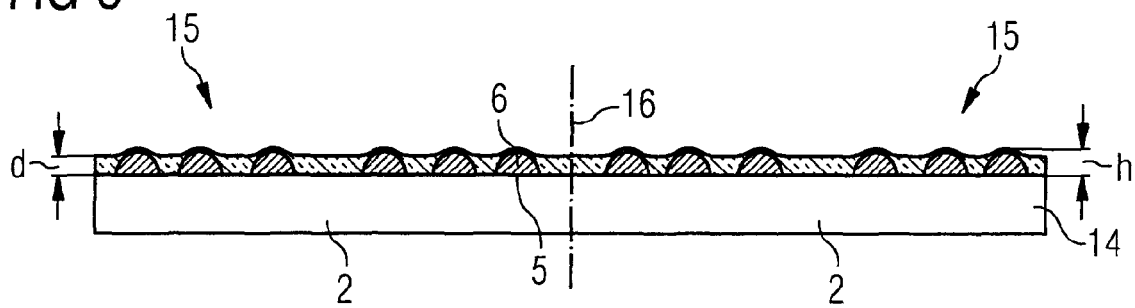
FIGS. 6 and 7 illustrate a method for producing an underfill layer on a semiconductor wafer according to a second embodiment of the invention.
Figure 7:
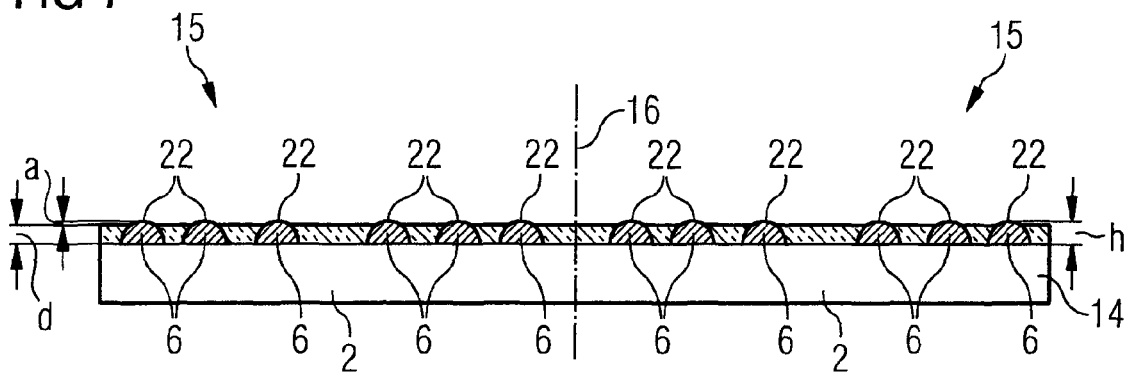

FIGS. 6 and 7 illustrate a method for producing an underfill layer on a semiconductor wafer according to a second embodiment of the invention.

FIG. 6 illustrates the application of a layer 17 on the active surface 4 of the semiconductor wafer 14. In this embodiment, the layer 17 includes a UV B-stageable material 13 and 10% solvent. After the application of the material 13 in the form of a layer 17, the solvent is evaporated. This leads to a reduction of the thickness d of the layer 17, so that the thickness d between the flip-chip contact 6 is less than the height h of the flip-chip contacts 6. The tip of the flip-chip contacts is coated with a very thin layer of the UV B-stageable material 13. The surface of the layer 17 thus has elevations.

A patterned mask 18 is arranged on the layer 17 and the layer 17 is exposed by means of UV radiation. In a manner similar to the method as described in conjunction with FIG. 4, the regions 19 of the layer 17 which are arranged above the flip-chip contacts remain unexposed and in a non-curing state. The exposed regions 21 are brought to the B-stage.

FIG. 7 illustrates a basic schematic diagram of the wafer 14 after the removal of the unexposed regions 19 by means of a solvent. Openings 22 each with a flip-chip contact 6 uncovered therein are thereby produced in the surface. In this embodiment, the thickness d of the layer 17 is less than the height h of the flip-chip contacts. The tips of the flip-chip contacts project with a height a from the surface of the layer 17.

As described above, the individual device positions 15 are separated from the wafer 14 and mounted on a rewiring substrate 3 in order to specify an electronic device 1. The UV B-stageable material is fully cured by heat treatment after the mounting of the semiconductor chip 2 on the rewiring substrate 3, so that it can serve as underfill material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor chip having an active surface with flip-chip contacts, an opposing passive surface, and planar side edges extending between the active surface and the passive surface; and
   an electrically insulating layer surrounding the flip-chip contacts as underfill material, the layer comprising a UV B-stageable material, wherein the electrically insulating material layer extends across the active surface and has edges coplanar with and not extending beyond the planar side edges of the semiconductor chip.

2. The semiconductor device according to claim 1, comprising the flip chip contacts having flip-chip tips, wherein the layer has a thickness d greater than a height h of the flip-chip contact tips.

3. The semiconductor device according to claim 1, comprising wherein the layer has a thickness d, the flip-chip contact tips projecting with a height a from the layer, where a<d.

4. The semiconductor device according to claim 1, comprising wherein the layer includes openings each with a flip-chip contact arranged therein, at least the tips of the contacts being free of the UV B-stageable material.

5. The semiconductor device according to claim 1, comprising wherein at least the surface of the UV B-stageable material is in a cured intermediate state.

6. The semiconductor device according to claim 1, comprising wherein the UV B-stageable material is substantially fully cured.

7. The semiconductor device according to claim 1, comprising wherein the UV B-stageable material includes epoxy-based material or acrylic-based material.

8. The semiconductor device according to claim 1; comprising wherein the UV B-stageable material includes a proportion of up to approximately 10% of organic solvent.

9. The semiconductor device according to claim 1, comprising wherein the UV B-stageable material comprises a filler proportion of 30% by volume to 95% by volume, preferably 70% by volume to 85% by volume, the remainder plastic.

10. The semiconductor device according to claim 1, comprising wherein the UV B-stageable material includes ceramic particles.

11. The semiconductor device according to claim 1, comprising wherein the UV B-stageable material is water-soluble in a non-cured intermediate state.

12. The semiconductor device according to claim 1, which furthermore has a rewiring substrate with internal contact areas on its top side and external contact areas on its underside.

13. The semiconductor device according to claim 12, comprising electrically connecting the flip-chip contacts to the internal contact areas and the layer as underfill material surrounds the flip-chip contacts and the area of the layer substantially corresponds to the area of the semiconductor chip.

14. The semiconductor device according to claim 1, which has the form of a semiconductor wafer with semiconductor device positions arranged in rows and columns for semiconductor devices in flip-chip technology with contact areas on the active top side which comprise flip-chip contacts.

15. A semiconductor device comprising:
   a semiconductor chip having an active surface with flip-chip contacts an opposing passive surface, and planar side edges extending between the active surface and the passive surface; and
   means for providing an electrically insulating layer surrounding the flip-chip contacts, as underfill material, the insulating means comprising a UV B-stageable material extending across the active surface with edges coplanar with and not extending beyond the planar side edges of the semiconductor chip.

16. A semiconductor device comprising:
   a semiconductor chip having an active surface with flip-chip contacts, an opposing passive surface, and planar side edges extending between the active surface and the passive surface; and
   an electrically insulating layer surrounding the flip-chip contacts as underfill material, the layer comprising a UV B-stageable material, wherein the layer includes openings each with a flip-chip contact arranged therein, at least the tips of the contacts being free of the UV B-stageable material, wherein at least the surface of the UV B-stageable material is in a cured intermediate state, and wherein the electrically insulating material layer extends across the active surface and has edges coplanar with and not extending beyond the planar side edges of the semiconductor chip.

17. The semiconductor device according to claim 16, comprising wherein the UV B-stageable material is substantially fully cured.

18. The semiconductor device according to claim 16, comprising wherein the UV B-stageable material includes epoxy-based material or acrylic-based material.

19. The semiconductor device according to claim 16, comprising wherein the UV B-stageable material includes a proportion of up to approximately 10% of organic solvent.

20. The semiconductor device according to claim 16, comprising wherein the UV B-stageable material comprises a filler proportion of 30% by volume to 95% by volume, preferably 70% by volume to 85% by volume, the remainder plastic.

21. The semiconductor device according to claim 16, comprising:
   a rewiring substrate with internal contact areas on its top side and external contact areas on its underside, and comprising electrically connecting the flip-chip contacts to the internal contact areas and the layer as underfill material surrounds the flip-chip contacts and the area of the layer substantially corresponds to the area of the semiconductor chip; and
   which has the form of a semiconductor wafer with semiconductor device positions arranged in rows and columns for semiconductor devices in flip-chip technology with contact areas on the active top side which comprise flip-chip contacts.

* * * * *